(12) United States Patent
Ichinose

(10) Patent No.: US 12,349,347 B2
(45) Date of Patent: Jul. 1, 2025

(54) THREE-DIMENSIONAL MEMORY STACK STRUCTURE WITH SOURCE LINE INCLUDING AN INSULATING DIVIDING PORTION

(71) Applicant: Kioxia Corporation, Tokyo (JP)

(72) Inventor: Daigo Ichinose, Nagoya (JP)

(73) Assignee: Kioxia Corporation, Tokyo (JP)

( * ) Notice: Subject to any disclaimer, the term of this patent is extended or adjusted under 35 U.S.C. 154(b) by 836 days.

(21) Appl. No.: 17/409,900

(22) Filed: Aug. 24, 2021

(65) Prior Publication Data

US 2022/0208786 A1 Jun. 30, 2022

(30) Foreign Application Priority Data

Dec. 25, 2020 (JP) .................. 2020-217402

(51) Int. Cl.
*H10B 43/27* (2023.01)
*H01L 21/768* (2006.01)
(Continued)

(52) U.S. Cl.
CPC ....... *H10B 43/27* (2023.02); *H01L 21/76805* (2013.01); *H01L 21/76816* (2013.01);
(Continued)

(58) Field of Classification Search
CPC ........ H10B 43/10; H10B 43/27; H10B 43/35; H10B 43/40; H10B 43/50;
(Continued)

(56) References Cited

U.S. PATENT DOCUMENTS 10,566,339 B2 2/2020 Fujii et al.
2019/0279996 A1 9/2019 Yamashita
(Continued)

FOREIGN PATENT DOCUMENTS

| JP | 2019-160922 A | 9/2019 |
| JP | 2019-165133 A | 9/2019 |
| JP | 2020-047727 A | 3/2020 |

*Primary Examiner* — Marcos D. Pizarro
(74) *Attorney, Agent, or Firm* — Oblon, McClelland, Maier & Neustadt, L.L.P.

(57) ABSTRACT

According to one embodiment, a semiconductor storage device includes a stacked body, a columnar body, a conductive member, a plate-like portion, and a dividing portion. In the stacked body, a plurality of conductive layers and a plurality of insulating layers are alternately stacked one by one, and a stepped portion including the conductive layers is formed to be faced to an end in a first direction. The columnar body penetrates the stacked body, and includes a memory cell formed in a portion facing the conductive layer. The conductive member is electrically connected to the columnar body below the stacked body, and extends to a region laterally below the stacked body beyond the stepped portion in the first direction. The plate-like portion extends in a stacking direction of the stacked body in a lateral region of the stacked body to reach the conductive member, and extends in a second direction intersecting the first direction. The dividing portion is disposed in the conductive member on the stepped portion side with respect to the plate-like portion, partially divides the conductive member, and includes an insulating material.

14 Claims, 10 Drawing Sheets

(51) Int. Cl.
  *H10B 43/10* (2023.01)
  *H10B 43/35* (2023.01)
  *H10B 43/40* (2023.01)
  *H10D 84/03* (2025.01)
  *H10D 88/00* (2025.01)

(52) U.S. Cl.
  CPC ............ *H10B 43/10* (2023.02); *H10B 43/35* (2023.02); *H10B 43/40* (2023.02); *H10D 84/038* (2025.01); *H10D 88/00* (2025.01); *H10D 88/01* (2025.01)

(58) Field of Classification Search
  CPC ......... H01L 21/76805; H01L 21/76816; H01L 21/8221; H01L 27/0688; H10D 84/038; H10D 88/00; H10D 88/01
  See application file for complete search history.

(56) References Cited

U.S. PATENT DOCUMENTS

| | | | |
|---|---|---|---|
| 2019/0296038 A1* | 9/2019 | Noda | H10B 43/50 |
| 2019/0393236 A1* | 12/2019 | Kaneko | H10B 43/50 |
| 2020/0091184 A1 | 3/2020 | Asai et al. | |

* cited by examiner

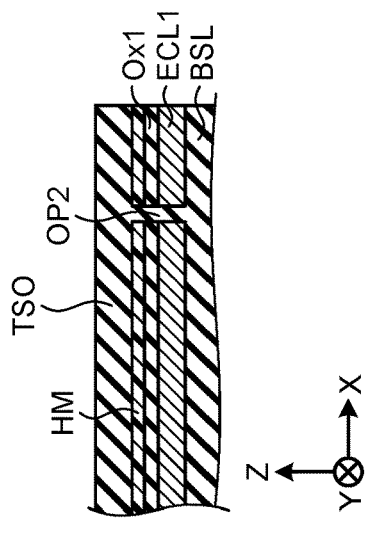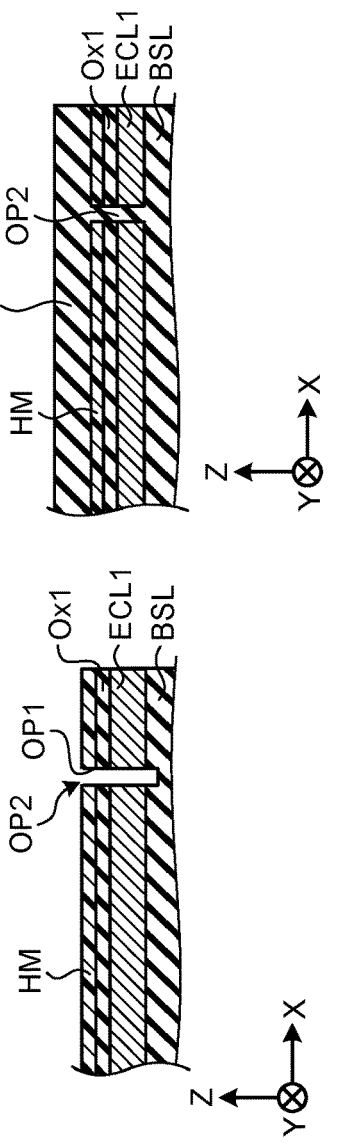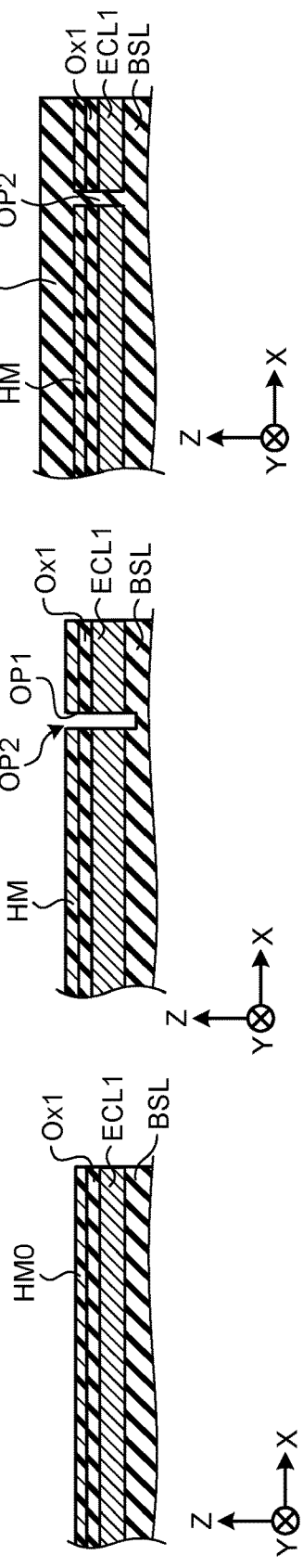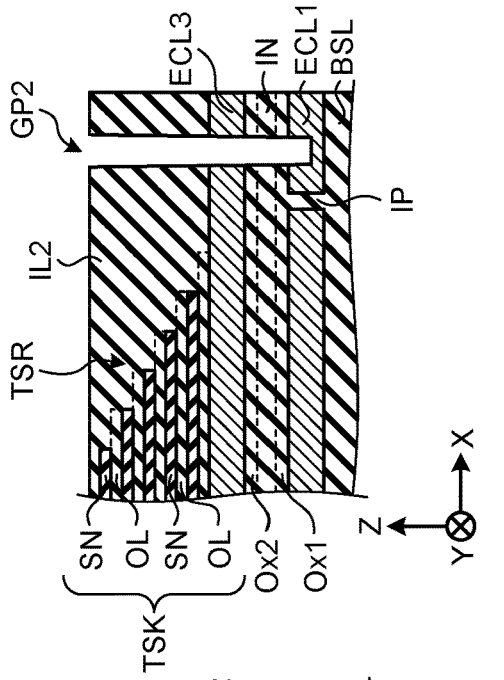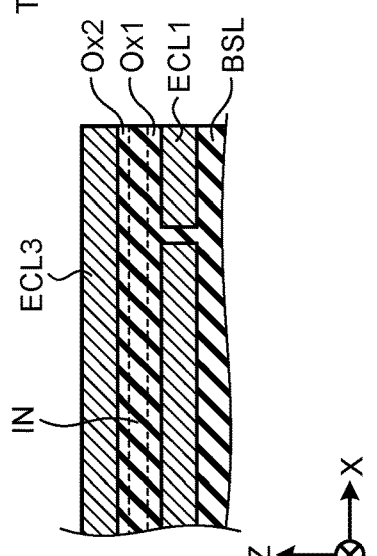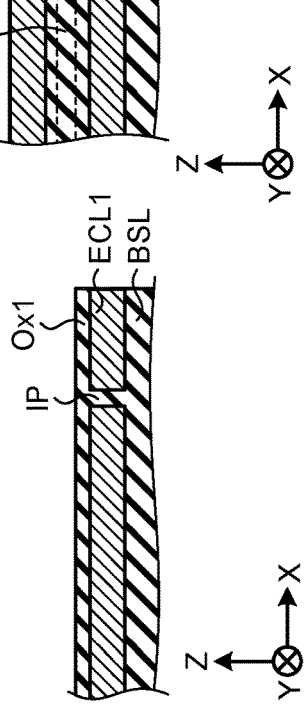

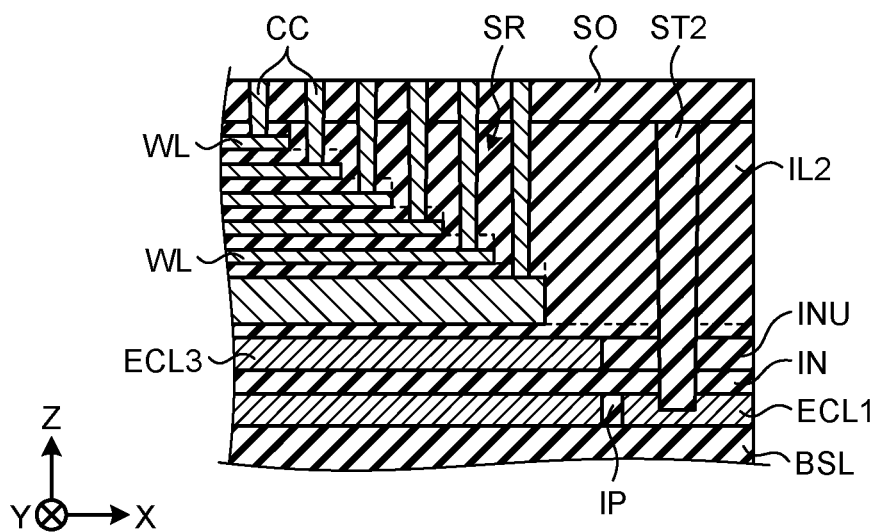
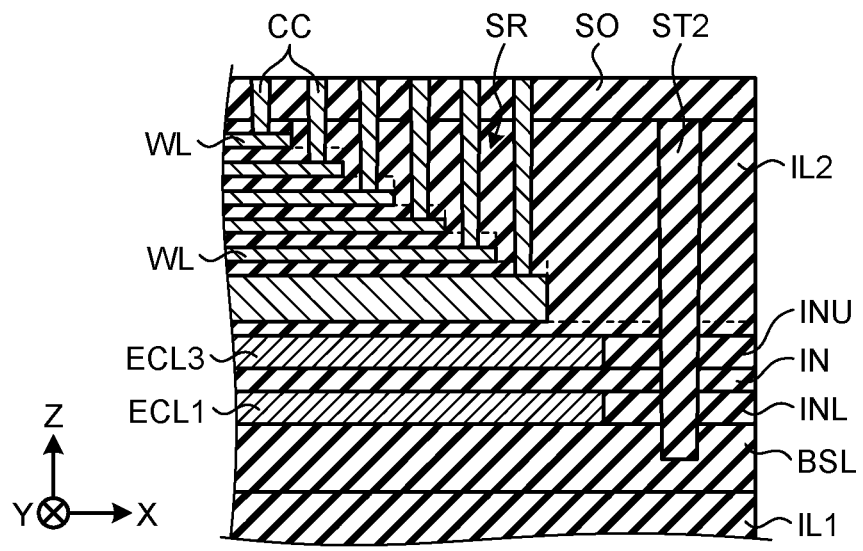

THREE-DIMENSIONAL MEMORY STACK STRUCTURE WITH SOURCE LINE INCLUDING AN INSULATING DIVIDING PORTION

CROSS-REFERENCE TO RELATED APPLICATIONS

This application is based upon and claims the benefit of priority from Japanese Patent Application No. 2020-217402, filed on Dec. 25, 2020; the entire contents of which are incorporated herein by reference.

FIELD

Embodiments described herein relate generally to a semiconductor storage device.

BACKGROUND

In a semiconductor device such as a semiconductor storage device, a three-dimensional structure is adopted in order to increase storage capacity. In order to further increase the storage capacity, a total film thickness of a thin film formed on a substrate such as a semiconductor wafer is further increasing. Under such circumstances, stress generated in the film increases due to, for example, a difference in thermal expansion coefficient between the substrate and various thin films, and peeling of the thin film due to this increase is concerned.

BRIEF DESCRIPTION OF THE DRAWINGS

FIGS. 7A to 7F are partial cross-sectional views for explaining a method for forming the dividing portion of the semiconductor storage device according to the embodiment;
FIGS. 10A and 10B are partial cross-sectional views illustrating the modifications of the dividing portion of the semiconductor storage device according to the embodiment.

DETAILED DESCRIPTION

Figure 1:
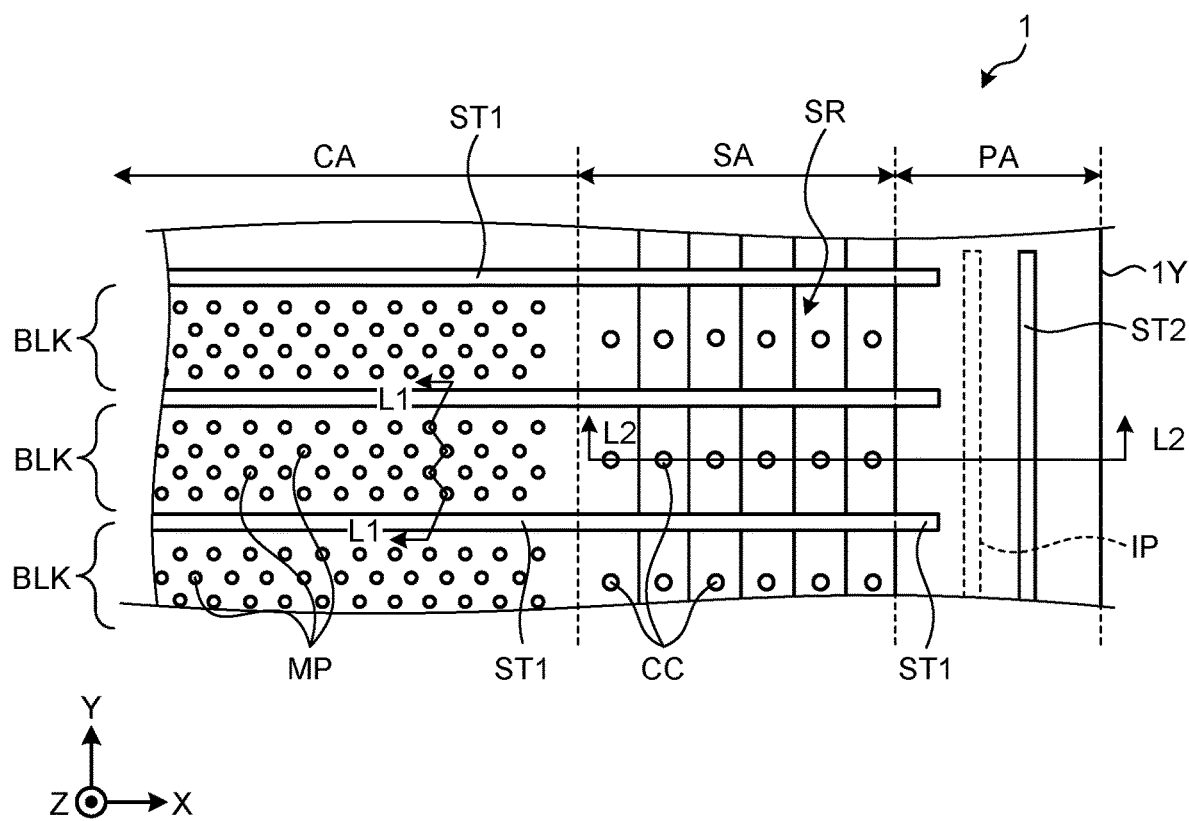
FIG. 1 is a partial top view of a semiconductor storage device according to an embodiment.

According to an embodiment, a semiconductor storage device is provided. The semiconductor storage device includes a stacked body, a columnar body, a conductive member, a plate-like portion, and a dividing portion. In the stacked body, a plurality of conductive layers and a plurality of insulating layers are alternately stacked one by one, and a stepped portion including the conductive layers is formed to be faced to an end in a first direction. The columnar body penetrates the stacked body, and includes a memory cell formed in a portion facing at least one of the conductive layers. The conductive member is electrically connected to the columnar body below the stacked body, and extends to a region laterally below the stacked body beyond the stepped portion in the first direction. The plate-like portion extends in a stacking direction of the stacked body in a lateral region of the stacked body to reach the conductive member, and extends in a second direction intersecting the stacking direction and the first direction. The dividing portion is disposed in the conductive member on the stepped portion side with respect to the plate-like portion, partially divides the conductive member, and includes an insulating material.

Hereinafter, non-limiting exemplary embodiments of the present invention will be described with reference to the accompanying drawings. In all the accompanying drawings, the same or corresponding members or components are denoted by the same or corresponding reference numerals, and redundant description will be omitted. Further, the drawings are not intended to illustrate relative ratios between members or components or between thicknesses of various layers, and thus specific thicknesses and dimensions may be determined as appropriate by those skilled in the art in light of the following non-limiting embodiments.

Figure 2:
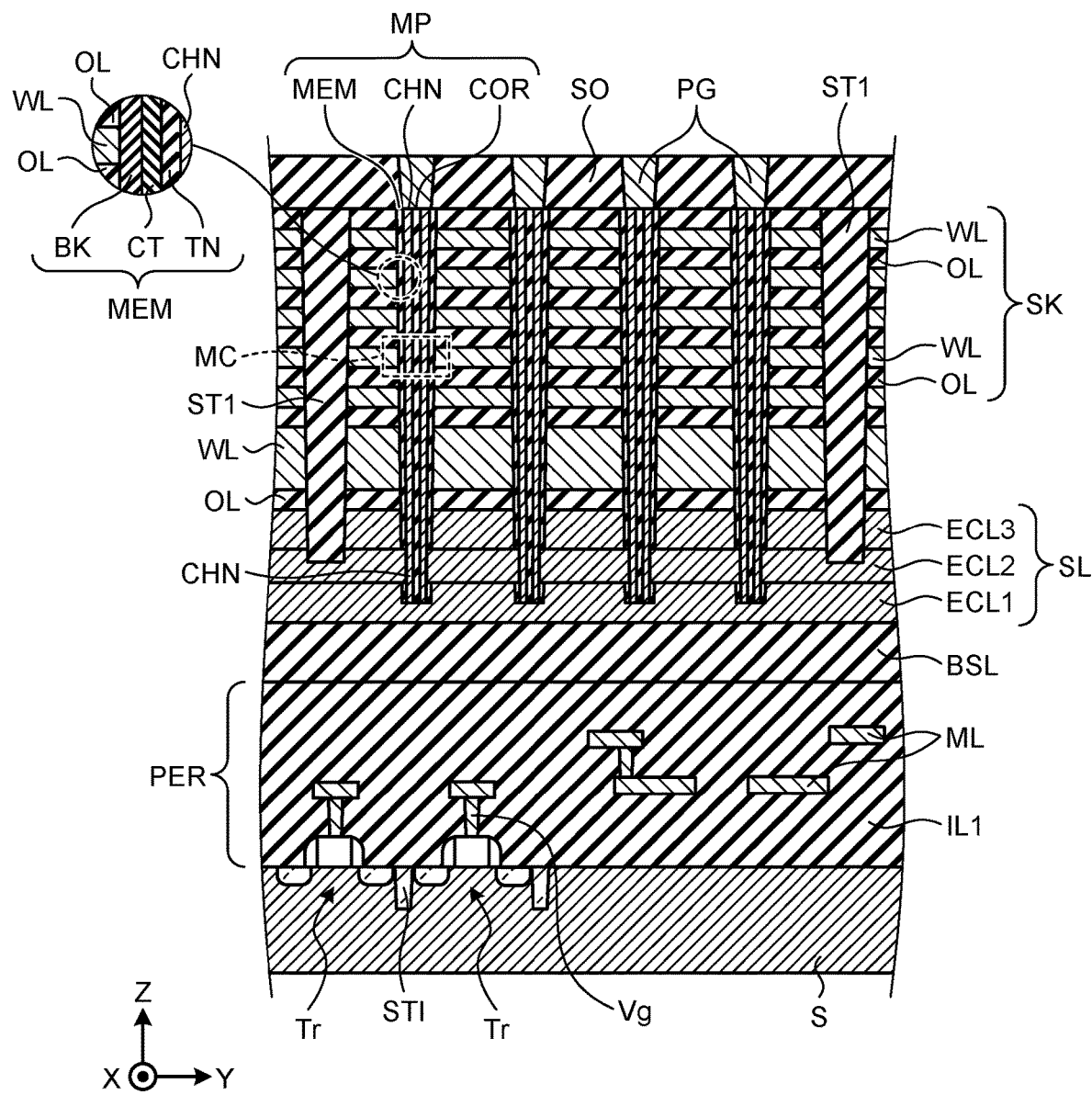
FIG. 2 is a cross-sectional view taken along a line L1-L1 of FIG. 1.
Figure 3:
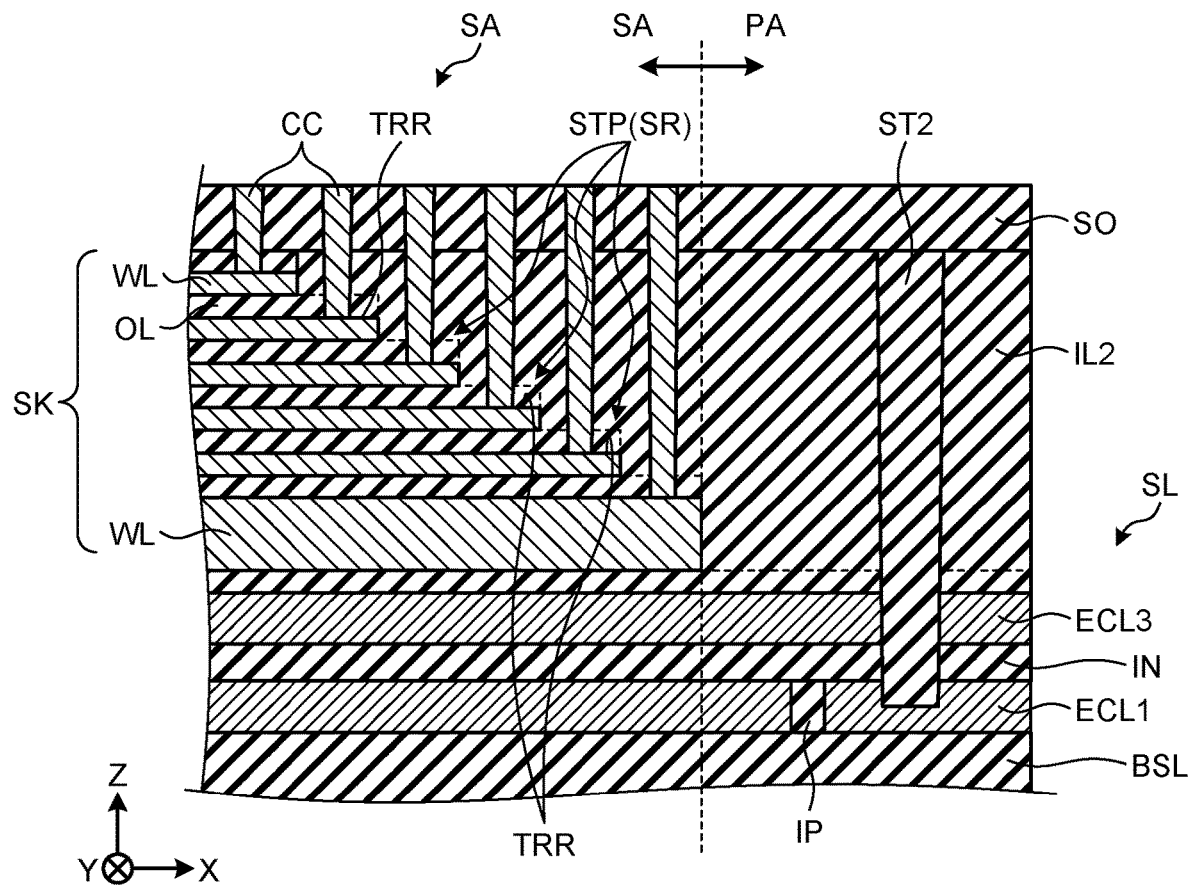
FIG. 3 is a cross-sectional view taken along a line L2-L2 of FIG. 1.

FIG. 1 is a partial top view of the semiconductor storage device according to the embodiment, FIG. 2 is a cross-sectional view taken along a line L1-L1 of FIG. 1, and FIG. 3 is a cross-sectional view taken along a line L2-L2 of FIG. 1. The semiconductor storage device 1 according to the present embodiment includes a substantially rectangular substrate formed of a semiconductor such as silicon, a peripheral circuit portion (described later) formed above the substrate, and a storage element portion formed above the peripheral circuit portion.

Referring to FIG. 1, the semiconductor storage device 1 includes a cell array region CA and a stepped region SA in the storage element portion. A plurality of memory pillars MP are provided in the cell array region CA, and the memory pillars MP are arranged in a lattice pattern in an xy plane in the drawing and extend in a z direction in the drawing. The stepped region SA includes a stepped portion SR, and the stepped portion SR has a plurality of steps as described later. In addition, although an upper wiring layer including an upper wiring, a plug, and the like is provided above the cell array region CA and the stepped region SA, illustration thereof is omitted in FIG. 1. Note that an area between the stepped region SA and an end 1Y of the semiconductor storage device 1 may be referred to as a peripheral region PA.

In addition, the semiconductor storage device 1 is provided with a plurality of first plate-like portions ST1 that divide the cell array region CA and the stepped region SA into a plurality of blocks ELK. Each first plate-like portion ST1 passes through the cell array region CA and the stepped region SA in an x direction and terminates in the peripheral region PA. The first plate-like portion ST1 extends in the z direction in the drawing and terminates in a source line SL to be described later. In addition, the semiconductor storage device 1 has a second plate-like portion ST2 in the peripheral region PA. The second plate-like portion ST2 has a plate-like shape extending in a y direction and the z direction. In addition, a dividing portion IP extending in the y direction substantially parallel to the second plate-like portion ST2 is provided on the stepped region SA side with respect to the second plate-like portion ST2. The dividing portion IP is formed in the source line SL as described later.

Referring to FIG. 2, a transistor Tr separated by an element isolation portion STI is formed on a surface layer of a substrate S. A first interlayer insulating film IL1 is formed of an insulating material such as silicon oxide on the transistor Tr and the substrate S, and a via Vg connected to a gate electrode of the transistor Tr or the like and a wiring ML are provided in the first interlayer insulating film IL1. The transistor Tr, the via Vg, the wiring ML, and the first interlayer insulating film IL1 constitute a peripheral circuit portion PER that controls the memory cell to be described later.

An insulating film BSL is provided on the first interlayer insulating film IL1. The insulating film BSL can be formed of, for example, the insulating material such as silicon oxide. Here, since the insulating film BSL is formed of the same insulating material as the first interlayer insulating film IL1, the insulating film BSL and the first interlayer insulating film IL1 can be regarded as substantially one insulator film portion, and the storage element portion is provided above the insulator portion as a base layer. Specifically, the source line SL is formed on the insulating film BSL. The source line SL includes a first conductive layer ECL1, a second conductive layer ECL2, and a third conductive layer ECL3, which are stacked in this order. The first conductive layer ECL1, the second conductive layer ECL2, and the third conductive layer ECL3 are formed of, for example, conductive polycrystalline silicon doped with impurities such as arsenic and antimony.

A stacked body SK is formed on the source line SL. In the stacked body SK, a plurality of insulating layers OL and a plurality of conductive layers WL are alternately stacked one by one. The insulating layer OL is formed of the insulating material, for example, silicon oxide, and the conductive layer WL is formed of a metal, for example, tungsten or molybdenum.

As illustrated, the memory pillar MP penetrates the stacked body SK, the third conductive layer ECL3, and the second conductive layer ECL2 in the z direction (stacking direction of the stacked body SK) and terminates in the first conductive layer ECL1. The memory pillar MP has a bottomed substantially cylindrical shape, and includes a core layer COR, a channel layer CHN, and a memory film MEM which are concentrically formed from a center toward an outside thereof. Here, the core layer COR may be formed of, for example, silicon oxide, and the channel layer CHN may be formed of, for example, conductive polycrystalline silicon or amorphous silicon. Further, as illustrated in FIG. 2, the memory film MEM includes a tunnel insulating layer TN, a charge storage layer CT, and a block insulating layer BK which are sequentially formed in a direction from the center toward the outside of the memory pillar MP. The tunnel insulating layer TN and the block insulating layer BK may be formed of, for example, silicon oxide, and the charge storage layer CT may be formed of, for example, silicon nitride.

A memory cell MC is formed in a portion where the conductive layer WL in the stacked body SK faces the memory film MEM of the memory pillar MP. In this case, the conductive layer WL functions as a word line. However, a portion where an uppermost conductive layer WL and a lowermost conductive layer WL among the conductive layers WL face the memory pillar MP functions as a selection transistor. That is, the uppermost conductive layer WL in the stacked body SK corresponds to a drain side select gate line, and the lowermost conductive layer WL corresponds to a source side select gate line. Note that, for example, a conductive polycrystalline silicon layer can also be used as the source side select gate line.

In addition, in the memory pillar MP, the memory film MEM is not provided in a range corresponding to between a lower surface and an upper surface of the second conductive layer ECL2 of the source line SL. Therefore, in this range, the channel layer CHN constitutes an outer surface of the memory pillar MP. Then, the channel layer CHN is in contact with the second conductive layer ECL2. Thus, the channel layer CHN and the source line SL are electrically connected. That is, the source line SL functions as a source for the memory cell MC formed in the memory pillar MP as a whole. Since the channel layer CHN is in contact with the second conductive layer ECL2 on an outer peripheral surface thereof, a contact area thereof can be increased, and thus a contact resistance can be reduced.

An insulating film SO is formed on the stacked body SK and the memory pillar MP, and a plug PG connected to the channel layer CHN of the memory pillar MP is embedded in the insulating film SO. In addition, the plug PG is connected to an upper wiring (not illustrated), and the upper wiring is connected to a through contact (not illustrated) that penetrates the stacked body SK and is connected to the peripheral circuit portion PER.

The first plate-like portion ST1 penetrates the stacked body SK and the third conductive layer ECL3 from an upper surface of the stacked body SK and terminates in the second conductive layer ECL2. The first plate-like portion ST1 is formed by embedding, for example, silicon oxide in a slit described later (see slits GP1 in FIG. 6C) penetrating the stacked body SK and the like with. However, the metal such as tungsten or molybdenum may be embedded instead of silicon oxide. In this case, the first plate-like portion ST1 can function as a source line contact electrically connected to the source line SL. Further, in this case, before the slit is filled with the metal, a liner layer made of the insulating material such as silicon oxide is formed on an inner wall of the slit.

FIG. 3 is a cross-sectional view taken along the line L2-L2 in FIG. 1, and illustrates the stepped region SA and a structure below the stepped region SA. However, although the peripheral circuit portion PER is also provided below the stepped region SA, it has the same configuration as the peripheral circuit portion PER (FIG. 2) below the cell array region CA, and thus it is not illustrated in FIG. 3.

The stepped portion SR has a plurality of steps STP, and in the present embodiment, each step STP includes a set of conductive layers WL and insulating layers OL. A second interlayer insulating film IL2 is formed above the stepped portion SR. The second interlayer insulating film IL2 is formed of the same insulating material as the insulating material (for example, silicon oxide) of the insulating layer OL, and thus the insulating layer OL and the second interlayer insulating film IL2 are substantially integrated. Each of the conductive layers WL extends in the x direction from the cell array region CA to the stepped region SA, and an extending length thereof is reduced as the conductive layer WL is located at an upper position, that is, as the conductive layer WL is located farther from the source line SL. Thus, the conductive layer WL becomes a substantial terrace surface (tread surface) TRR of the step STP. Note that an end in the x direction of the lowermost conductive layer WL corresponds to an end in the x direction of the stacked body SK, and in the present embodiment, the end in the x direction of the stacked body SK separates the stepped region SA from the peripheral region PA. Note that from a viewpoint of stress relaxation to be described later, the second plate-like portion ST2 is disposed at a position within 5 µm, more preferably at a position within 1 µm in the x direction from the end in the x direction of the stacked body SK.

A contact CC penetrating the insulating film SO and the second interlayer insulating film IL2 is connected to the terrace surface TRR of the conductive layer WL. The contact CC can be formed of, for example, the metal such as tungsten or molybdenum. The contact CC is connected to the peripheral circuit portion PER (FIG. 2) by the upper wiring or the through contact (not illustrated), and a predetermined voltage is applied from the peripheral circuit portion PER to the memory cell MC (FIG. 2) via the conductive layer WL as the word line. Note that contacts may be connected to the stepped conductive layers WL father from the peripheral region PA assuming that another stepped portion other than the stepped portion SR is provided for the conductive layers WL within the cell array region CA. In this case, the contact CC of the stepped portion SR can be omitted, and thus the stepped portion SR may be a so-called dummy stepped portion.

Further, the third conductive layer ECL3 of the source line SL extends from the cell array region CA below the stepped portion SR and the second interlayer insulating film IL2, and an insulating layer IN is provided below the third conductive layer ECL3. The insulating layer IN is in contact with the second conductive layer ECL2 at a predetermined position between the stepped region SA and the cell array region CA. That is, while the second conductive layer ECL2 is provided below the third conductive layer ECL3 in the cell array region CA, the insulating layer IN is provided below the third conductive layer ECL3 in the stepped region SA.

Under the insulating layer IN, the first conductive layer ECL1 of the source line SL extends from the cell array region CA. In addition, in the first conductive layer ECL1, the second plate-like portion ST2 penetrating the second interlayer insulating film IL2, the third conductive layer ECL3, and the insulating layer IN is terminated. In the present embodiment, the second plate-like portion ST2 is formed by forming a slit in the same step as the slit for the first plate-like portion ST1 and embedding the slit with the insulating material as described later. The second plate-like portion ST2 and the slit for the second plate-like portion ST2 have a function of alleviating stress that can occur in the cell array region CA, the stepped region SA, and the peripheral region PA.

Figure 4:
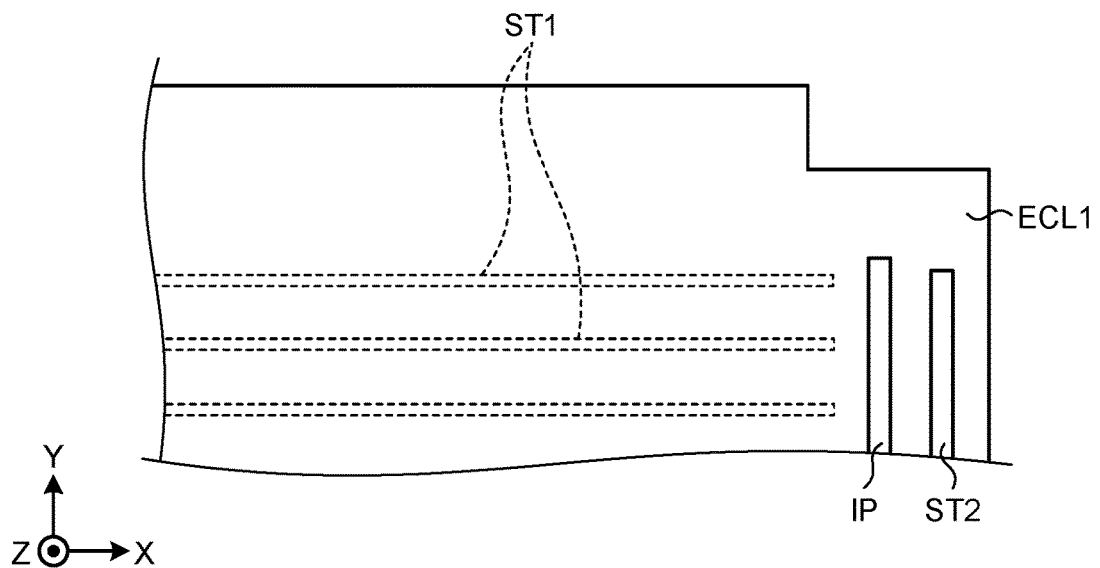
FIG. 4 is a partial top view illustrating a plan view shape of a dividing portion in the semiconductor storage device according to the embodiment.

In addition, the first conductive layer ECL1 is provided with the dividing portion IP that partially divides the first conductive layer ECL1. The dividing portion IP may be formed of the same material as the insulating material constituting the insulating layer IN. FIG. 4 is a partial top view illustrating a plan view shape of the dividing portion IP, and specifically corresponds to a partial top view of the first conductive layer ECL1. For convenience, a position of the first plate-like portion ST1 is indicated by a broken line. As illustrated, in the present embodiment, the dividing portion IP extends in the y direction substantially parallel to the second plate-like portion ST2 in the peripheral region PA and terminates in the first conductive layer ECL1. That is, the dividing portion IP does not completely divide the first conductive layer ECL1. In other words, the first conductive layer ECL1 communicates on both sides in the x direction of the dividing portion IP through a region outside a y-direction end of the dividing portion IP, and thus can be electrically conducted on both sides of the dividing portion IP.

Hereinafter, a method for forming the cell array region CA will be described with reference to FIGS. 5A to 5C and FIGS. 6A to 6C. FIGS. 5A to 5C and FIGS. 6A to 6C are partial cross-sectional views for explaining the method for forming the cell array region CA for each main step, and correspond to the partial cross-sectional view illustrated in FIG. 2. Note that prior to the forming method, for example, it is assumed that the above-mentioned peripheral circuit portion PER (FIG. 2) is formed on a semiconductor wafer such as a silicon wafer, and the insulating film BSL is formed on the interlayer insulating film IL1 of the peripheral circuit portion PER.

Figure 5A:
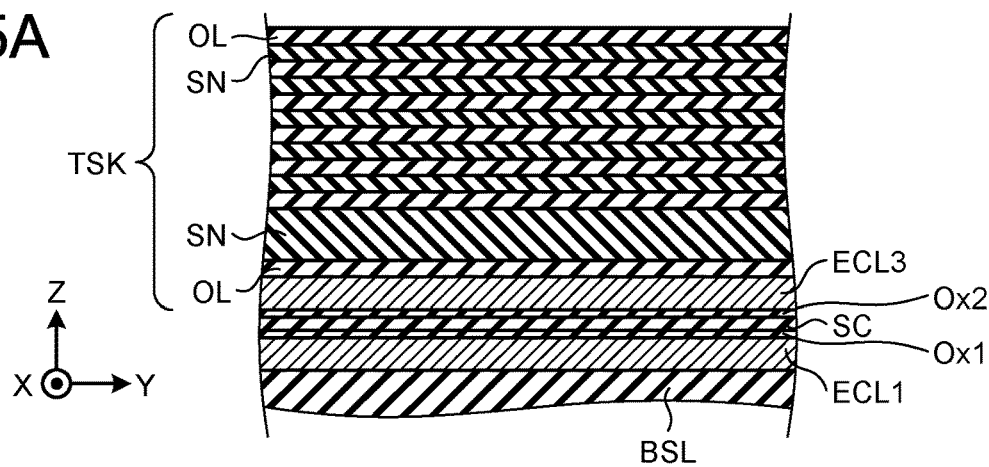
FIGS. 5A to 5C are partial cross-sectional views for explaining a method for forming a cell array region of the semiconductor storage device according to the embodiment.

Referring to FIG. 5A, the first conductive layer ECL1, a silicon oxide film Ox1, a sacrificial film SC, a silicon oxide film Ox2, and the third conductive layer ECL3 are sequentially formed on the insulating film BSL. Here, the sacrificial film SC may be formed of silicon nitride. In addition, a stacked body TSK in which the insulating layers OL and a plurality of silicon nitride layers SN are alternately stacked one by one is formed on the third conductive layer ECL3. Note that the stacked body SK described above is formed by replacing the silicon nitride layer SN of the stacked body TSK with the conductive layer WL. The insulating layer CL is the same in the stacked body SK and the stacked body TSK.

Figure 5B:
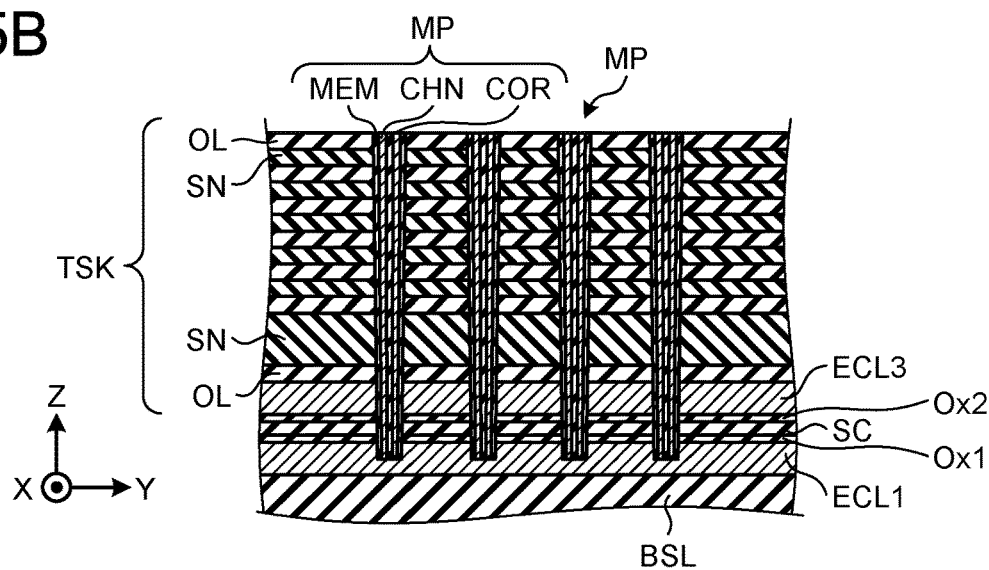
Figure 5C:
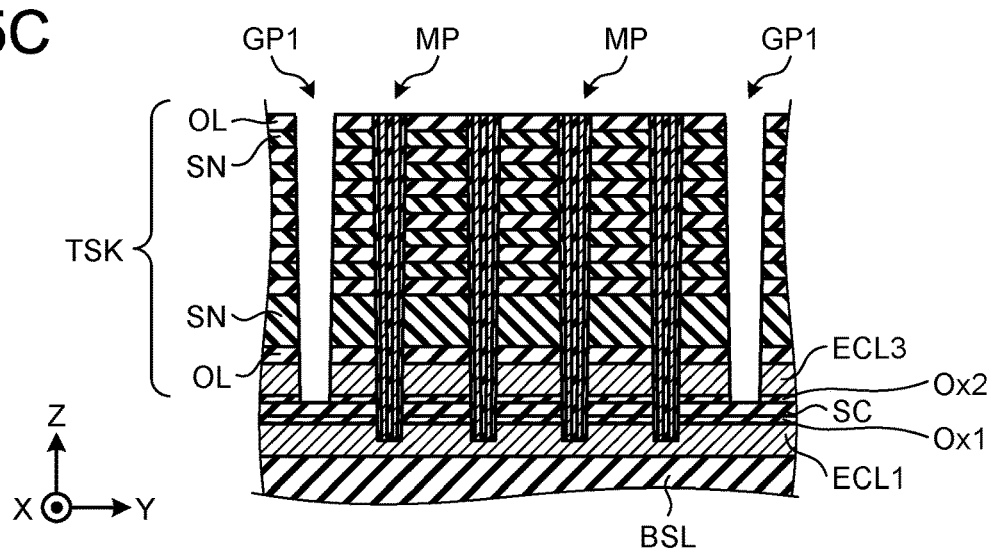

Next, as illustrated in FIG. 5B, a plurality of (four in an illustrated example) the memory pillars MP penetrating the stacked body TSK are formed. Specifically, the memory pillar MP is formed by forming a memory hole penetrating the stacked body TSK and terminating in the first conductive layer ECL1 of the source line SL, and sequentially forming the memory film MEM, the channel layer CHN, and the core layer COR on the inner surface of the memory hole. Subsequently, as illustrated in FIG. 5C, the slits GP1 are formed on both sides of the four memory pillars MP. These slits GP1 are filled with the insulating material later to be the first plate-like portion ST1, but prior to that, they are used to replace the silicon oxide film Ox1, the sacrificial film SC, and the silicon oxide film Ox2 with the second conductive layer ECL2, and are further used to replace the silicon nitride layer SN in the stacked body TSK with the conductive layer WL.

Figure 6A:
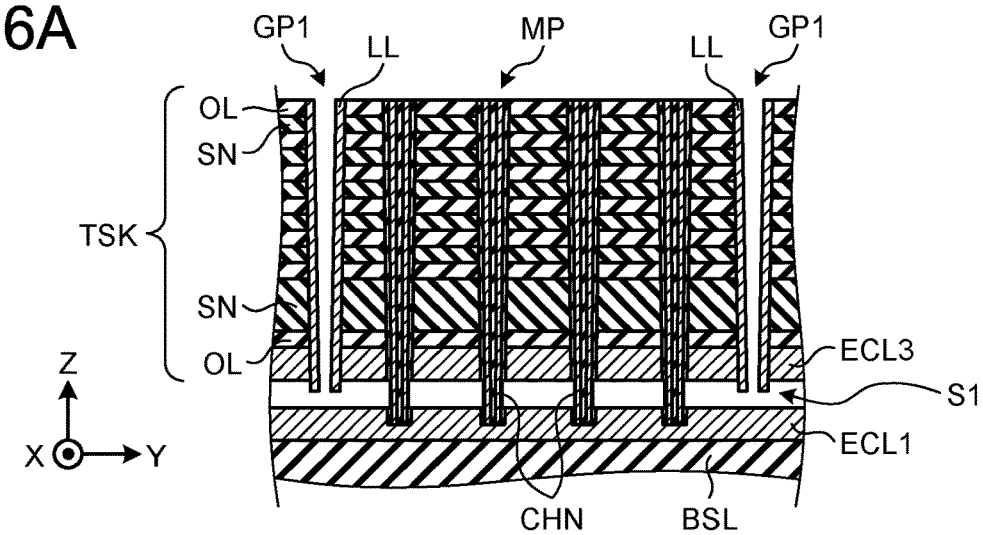
FIGS. 6A to 6C are partial cross-sectional views for explaining the method for forming the cell array region of the semiconductor storage device according to the embodiment, following FIGS. 5A to 5C.
Figure 6B:
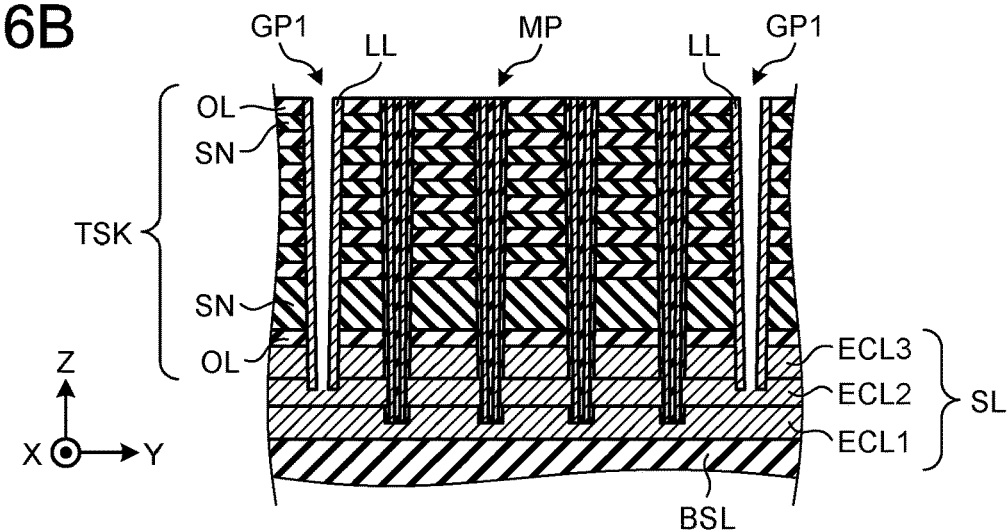

A liner layer LL is formed on an inner surface and a bottom surface of the slit GP1. The liner layer LL is formed to protect the insulating layer CL and the silicon nitride layer SN in the stacked body TSK when the sacrificial film SC, and the silicon oxide films Ox1 and Ox2 are removed. Examples of a material of the liner layer LL include polycrystalline silicon. When the liner layer LL formed on the bottom surface of the slit GP1 is removed by anisotropic etching, the sacrificial film SC is exposed on the bottom surface of the slit GP1. Subsequently, when the sacrificial film SC, and the silicon oxide films Ox1 and Ox2 are sequentially removed through the slit GP1, a space S1 is formed as illustrated in FIG. 6A. In addition, the memory film MEM of the memory pillar MP is also removed together with formation of the space S1, and the channel layer CHN is exposed to the side surface of the memory pillar MP. Subsequently, as illustrated in FIG. 6B, the second conductive layer ECL2 is formed by embedding conductive polycrystalline silicon in the space S1 through the slit GP1. Thus, the source line St and the channel layer CHN of the memory pillar MP are electrically connected.

Figure 6C:
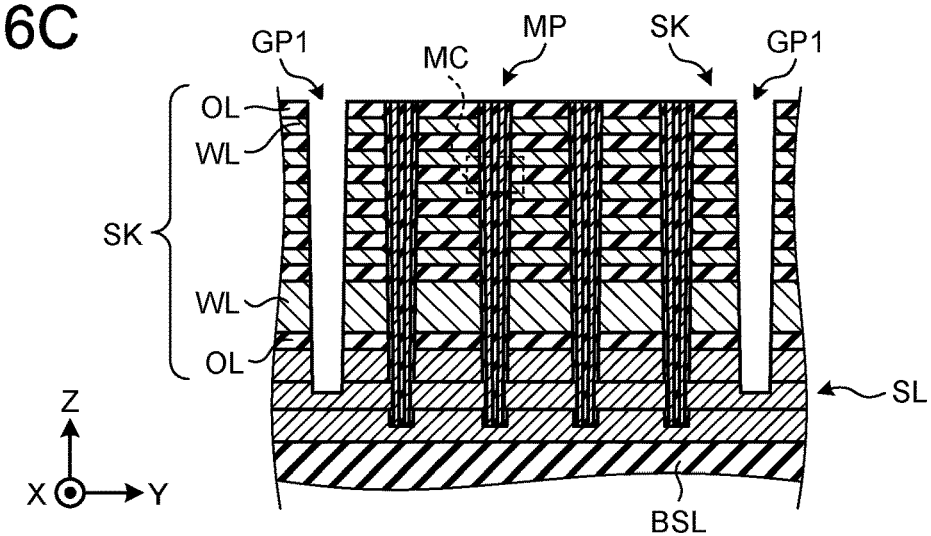

Subsequently, when the liner layer LL in the slit GP1 is removed, the insulating layer OL and the silicon nitride layer SN are exposed to the inner surface of the slit GP1. Then, the silicon nitride layer SN in the stacked body TSK is etched and removed through the slit GP1. A conductive material such as tungsten or molybdenum is embedded in a space generated by removing the silicon nitride layer SN, and the conductive layer WL as the word line is formed (FIG. 6C). Thus, the stacked body SK is obtained. Thereafter, when the slit GP1 is filled with the insulating material (for example, silicon oxide) and the insulating film SO having the plug PG is formed on the stacked body SK, a structure of the cell array region CA is obtained (FIG. 2).

Note that the space generated by removing the silicon nitride layer SN through the slit GP1 is defined by two insulating layers CL vertically adjacent to each other, but an alumina film as a protective layer may be formed on exposed surfaces of the insulating layers CL through the slit GP1.

Next, a method for forming the dividing portion IP (FIG. 3) of the first conductive layer ECLI will be described with reference to FIGS. 7A to 7F. FIGS. 7A to 7F are partial cross-sectional views for explaining the method for forming the dividing portion IP. For convenience of description, a structure below the insulating film BSL is omitted.

Referring to FIG. 7A, the silicon oxide film Ox1 is formed on the first conductive layer ECL1 on the insulating film BSL, and a silicon nitride film HM0 to be an etching mask (a hard mask) is formed thereon. The first conductive layer ECL1 and the silicon oxide film Ox1 extend from the cell array region CA to the peripheral region PA beyond the stepped region SA. That is, the first conductive layer ECL1 and the silicon oxide film Ox1 are formed in the cell array region CA, the stepped region SA, and the peripheral region PA, and the silicon nitride film HM0 is formed on the silicon oxide film Ox1 before the sacrificial film SC illustrated in FIG. 5A is formed.

Next, as illustrated in FIG. 7B, an opening OP1 is formed in the silicon nitride film HM0 by a photolithography step and an etching step, and a hard mask HM is obtained. Subsequently, an opening OP2 is formed by a plasma etching method such as a reactive ion etching (RIE) method using the hard mask HM. The opening OP2 penetrates the silicon oxide film Ox1 and the first conductive layer ECL1 and terminates in the insulating film BSL. The opening OP2 is embedded with the insulating material later to be the dividing portion IP, and extends in the y direction as illustrated in FIG. 4.

Referring to FIG. 7C, the insulating film TSO is formed on the hard mask HM. The insulating film TSO is formed of, for example, the insulating material such as silicon oxide, and the opening OP2 is embedded by the insulating material. Subsequently, the insulating film TSO and the hard mask HN are removed by the plasma etching method. At this time, as illustrated in FIG. 7D, the insulating material remains in the opening OP2 of the first conductive layer ECL1, whereby the dividing portion IP is obtained.

Subsequently, as illustrated in FIG. 7E, the insulating layer IN such as silicon oxide is formed on the silicon oxide film Ox1. Here, prior to formation of the insulating layer IN, the sacrificial film SC is formed on the silicon oxide film Ox1 as illustrated in FIG. 5A. Since the sacrificial film SC is formed not only in the cell array region CA but also in the stepped region SA and the peripheral region PA, in the stepped region SA and the peripheral region PA, the insulating layer IN is formed on the silicon oxide film Ox1 after the sacrificial film SC is removed by the photolithography step and the etching step. Then, the silicon oxide film Ox2 is formed on the insulating layer IN. At this time, the insulating layer IN and the silicon oxide film Ox2 are substantially integrated and also formed on the sacrificial film SC in the cell array region CA. The insulating layer IN and the silicon oxide film Ox2 of the cell array region CA may be left as they are on the sacrificial film SC, or may be thinned by, for example, a chemical mechanical polishing (CMP) method. Thereafter, the third conductive layer ECL3 is formed on the silicon oxide film Ox2 (on insulating layer IN substantially integrated with the silicon oxide films Ox1 and Ox2 in stepped region SA and peripheral region PA).

Subsequently, the stacked body TSK in which the insulating layers CL and the silicon nitride layers SN are alternately stacked one by one is formed on the third conductive layer ECL. The stacked body TSK is continuous with the stacked body TSK (FIG. 5A) in the cell array region CA described above. That is, the stacked body TSK is formed over the cell array region CA and the stepped region SA. Subsequently, a resist mask having an opening at a position where the stepped portion SR is to be formed is provided on an upper surface of the stacked body TSK, and by continuing a process including, for example, etching, slimming of the resist mask, and re-etching, a provisional stepped portion TSR is formed at an end of the stacked body TSK as illustrated in FIG. 7F.

Thereafter, for example, the silicon oxide film is deposited so as to cover the provisional stepped portion TSR. Subsequently, when the silicon oxide film is planarized by, for example, a CMP method, the second interlayer insulating film IL2 is obtained. Subsequently, a slit GP2 is formed by the lithography step and the etching step. The slit GP2 penetrates the second interlayer insulating film IL2, the third conductive layer ECL3, and the insulating layer IN, and terminates in the first conductive layer ECL1. The slit GP2 is provided for forming the second plate-like portion ST2, and extends in the y direction as illustrated in FIG. 4.

Note that the slit GP2 may be formed simultaneously with the slit GP1 (FIG. 5C). Here, as illustrated in FIG. 7F, the slit GP2 extends to the first conductive layer ECL1 and terminates therein, whereas the slit GP1 in FIG. 5C terminates at an upper surface of the sacrificial film SC and does not reach the first conductive layer ECL1. While the slit GP1 is formed by etching the stacked body TSK including the insulating layer OL and the silicon nitride layer SN, the slit GP2 is formed mainly by etching the second interlayer insulating film 1L2 formed of silicon oxide. Therefore, the slit GP2 is formed at an etching rate higher than that of the slit GP1. Thus, a length (depth) of the slit GP2 in the z direction increases.

Thereafter, the silicon nitride layers SN of the stacked body TSK illustrated in FIG. 7F is replaced with the conductive layers WL through the slit GP1, so that the provisional stepped portion TSR becomes the stepped portion SR (FIG. 3). This replacement is performed in the step described with reference to FIG. 6C. Further, the slit GP2 is embedded with the insulating material such as silicon oxide, so that the second plate-like portion ST2 is formed. The silicon oxide can be embedded in the slit GP2 by, for example, a plasma chemical vapor deposition (CVD) method. Subsequently, when the insulating film SO is formed on the interlayer insulating film IL2, and the contact CC connected to each terrace surface TRR of the stepped portion SR is formed, a structure illustrated in FIG. 3 is obtained.

Note that when the second plate-like portion ST2 is formed by the CVD method, silicon oxide is deposited on the inner surface and the bottom surface of the slit GP2, increasing in thickness on the inner surface and joining each other at a center of the slit GP2. In this manner, the slit GP2 is embedded to form the second plate-like portion ST2. Therefore, a seam along the z direction remains at a center of the second plate-like portion ST2. Presence of the second plate-like portion ST2 can be grasped by such a seam.

In addition, as described above, when the alumina film as the protective layer is formed on the upper and lower two insulating layers OL exposed to the space generated by removing the silicon nitride layer SN, the alumina film can be formed not only on the slit GP1 but also on the inner surface of the slit GP2 for the second plate-like portion ST2. The alumina films on the inner surfaces are removed after the conductive material is embedded in the above-described space, but may remain on the inner surface of the slit GP2. In this case, a contour of the second plate-like portion ST2 similarly formed of silicon oxide can be defined in the second interlayer insulating film IL2 formed of silicon oxide by the remaining alumina. That is, the presence of the second plate-like portion ST2 in the second interlayer insulating film IL2 can also be grasped by the remaining alumina.

Figure 8:
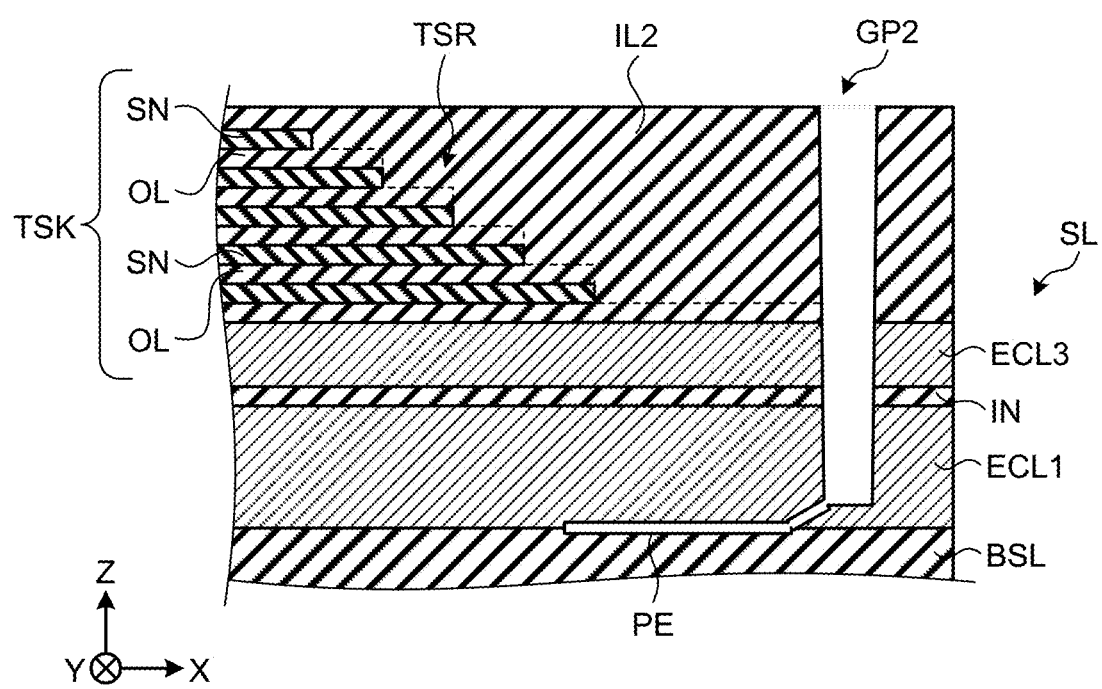
FIG. 8 is a partial cross-sectional view of the semiconductor storage device according to a comparative example.

Next, effects exhibited by the semiconductor storage device 1 according to the present embodiment will be described with reference to a comparative example. FIG. 8 is a partial cross-sectional view of the semiconductor storage device according to the comparative example, and corresponds to the cross-sectional view illustrated in FIG. 7F of the semiconductor storage device 1 according to the embodiment. As illustrated, in the semiconductor storage device according to the comparative example, the dividing portion IP is not provided, and the first conductive layer ECL1 is continuously formed on the insulating film BSL. Except for this point, the semiconductor storage device according to the comparative example has the same configuration as the semiconductor storage device 1 according to the embodiment.

In such a configuration, for example, when a high-temperature step such as annealing is performed after formation of the slit GP2 for the second plate-like portion ST2, the first conductive layer ECL1 may be peeled off from the insulating film BSL. As can be seen from the above description, the semiconductor storage device at this time includes the peripheral circuit portion PER (FIG. 2) on the substrate S, and a stacked body TSK including the insulating layer OL and the silicon nitride layer SN is formed thereon via the insulating film BSL and the source line SL (including the insulating layer IN). That is, a large number of layers are formed of various materials on the substrate S, and a total thickness thereof is relatively large. In such a situation, for example, when processing at a high temperature exceeding 800° C. is performed, a relatively large stress due to, for example, a difference in thermal expansion coefficient of the material acts between the substrate S and other layers. Then, it is considered that, for example, a crack occurs in the first conductive layer ECL1 from the bottom of the slit GP2 for the second plate-like portion ST2 due to the stress, and propagates to a boundary between the first conductive layer ECL1 and the insulating film BSL, which may cause peeling PE between the first conductive layer ECL1 and the insulating film BSL.

On the other hand, in the semiconductor storage device 1 according to the embodiment, the dividing portion IP is provided in the first conductive layer ECL1. Even if the crack occurs in the first conductive layer ECL1 below the slit GP2 due to the stress, the dividing portion IP prevents the peeling from propagating toward the stepped region SA. In particular, in the present embodiment, since the dividing portion IP is formed of the same insulating material (for example, silicon oxide) as the insulating film BSL, the dividing portion IP and the insulating film BSL can be brought into close contact with each other with a strong bonding force. Therefore, the peeling between the first conductive layer ECL1 and the insulating film BSL can be effectively suppressed.

In addition, the dividing portion IP does not completely divide the first conductive layer ECL1, and the first conductive layer ECL1 is electrically continuous on both sides in the x direction of the dividing portion IP. If the first conductive layer ECL1 is completely divided by the dividing portion IP, for example, a portion of the first conductive layer ECL on the end side with respect to the dividing portion IP is isolated and electrically floats. Then, for example, in a plasma process during a manufacturing process of the semiconductor storage device 1, arcing may occur in the portion. However, as described above, in the semiconductor storage device 1 according to the embodiment, the first conductive layer ECL1 is electrically continuous on both sides in the x direction of the dividing portion IP, and the first conductive layer ECL1 can be grounded through another circuit element, so that occurrence of arcing can be suppressed.

Next, modifications will be described with reference to FIGS. 9A to 9C and FIGS. 10A to 10C. FIGS. 9A to 9C and FIGS. 10A to 10C are partial cross-sectional views illustrating the modifications of the dividing portion.

(First Modification)

Figure 9A:
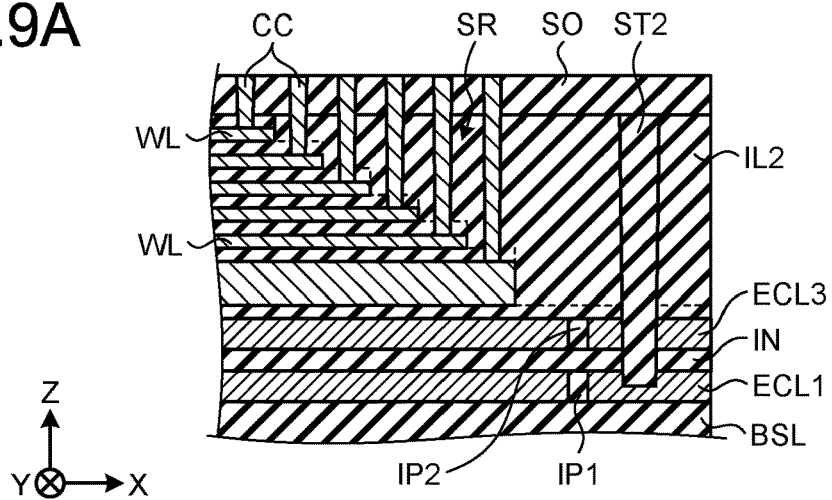
FIGS. 9A to 9C are partial cross-sectional views illustrating modifications of the dividing portion of the semiconductor storage device according to the embodiment.

Referring to FIG. 9A, a dividing portion IP1 is provided in the first conductive layer ECL1, and a dividing portion IP2 is provided in the third conductive layer ECL3. In this case, the dividing portions IP1 and IP2 may have the same plan view shape, and one width (a length in the x direction) may be greater than the other width. Further, the dividing portions IP1 and IP2 may be formed of the same insulating material as the insulating layer IN. Even in this case, even if the peeling occurs between the first conductive layer ECL1 and the insulating layer BSL below the slit GP2 for the second plate-like portion ST2, propagation of the peeling can be suppressed by the dividing portion IP1. Further, when the dividing portions IP1 and IP2 have the same planar shape, after formation of the third conductive layer ECL3, by one photoresist mask, not only an opening (corresponding to the opening OP2 in FIG. 7B) to be the dividing portion IP1 can be formed in the first conductive layer ECL1, but also an opening for the dividing portion IP2 can be formed in the third conductive layer ECL3. Therefore, the number of steps can be reduced as compared with a case where the dividing portion IP is formed only in the first conductive layer ECL1.

(Second Modification)

Figure 9B:
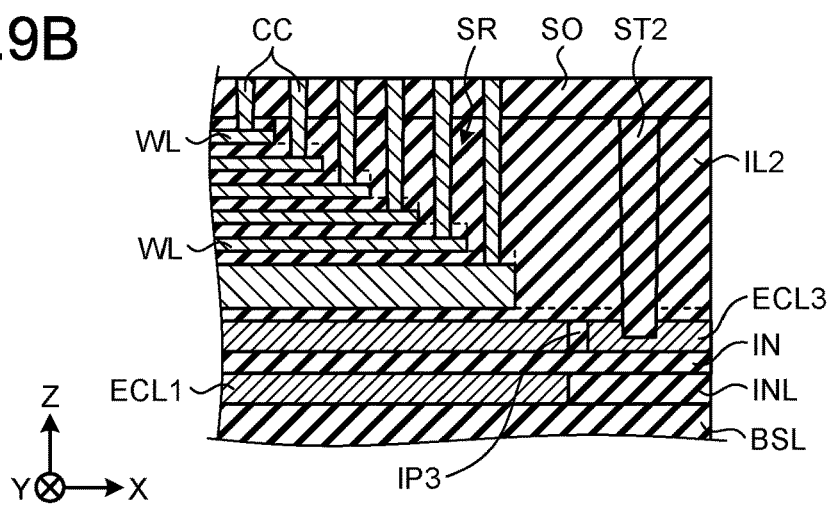

Referring to FIG. 9B, the extending length in the x direction of the first conductive layer ECL1 is shorter than the extending length in the x direction of the third conductive layer ECL3, and an end in the x direction of the first conductive layer ECL1 is in contact with the insulating layer INL. The insulating layer INL may be formed of the same insulating material as the insulating layer IN and the insulating film BSL, for example, silicon oxide. In addition, a dividing portion IP3 is provided in the third conductive layer ECL3, and the second plate-like portion ST2 is terminated in the third conductive layer ECL3, on the end side in the x-direction of the dividing portion IP3 in the third conductive layer ECL3. In this case, the peeling may occur between the third conductive layer ECL3 and the insulating layer IN, but the dividing portion IP3 can suppress progress of the peeling.

Note that, also in this modification, the slit GP2 for the second plate-like portion ST2 may be formed simultaneously with the slit GP1 for the first plate-like portion ST1, and for example, by adjusting the etching rate under an etching condition, the bottom surface of the slit GP1 can be positioned on the upper surface of the sacrificial film SC (see FIG. 5C), and the bottom surface of the slit GP2 can be positioned in the third conductive layer ECL3. Furthermore, for example, in FIG. 7B, the insulating layer INL can be formed by providing an opening wider in the x direction than the opening OP1 in the hard mask HM, removing the first conductive layer ECL1 by etching using the hard mask HM, forming the insulating film TSO (FIG. 7C), and etching back an entire surface thereof.

(Third Modification)

Figure 9C:
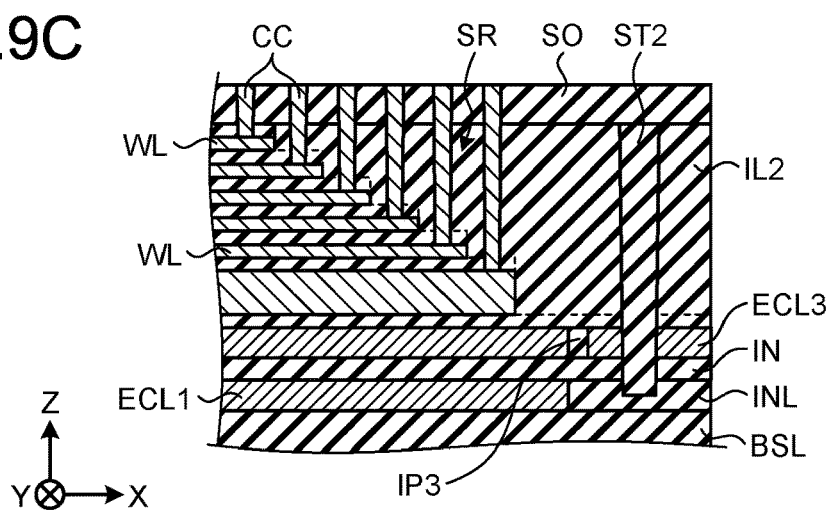

FIG. 9C illustrates a third modification in which the second modification described above is further modified. That is, the third modification is different from the second modification in that the second plate-like portion ST2 penetrates the third conductive layer ECL3 and terminates in the insulating layer INL, and is the same in other points. As described above, the insulating layer IN, the insulating layer INL, and the insulating film BSL are integrally formed of the same insulating material. Therefore, the crack is less likely to occur in the bottom surface of the slit GP2 for the second plate-like portion ST2, and rather, the peeling may occur at an interface between the third conductive layer ECL3 and the insulating layer IN. However, since the dividing portion IP3 is provided in the third conductive layer ECL3 as in the present modification, even if the peeling occurs, the propagation of the peeling can be suppressed. Note that the slit GP2 extending to the insulating layer INL can be formed by adjusting the etching rate at the time of forming the slit GP2 simultaneously with the slit GP1 for the first plate-like portion ST1.

(Fourth Modification)

Referring to FIG. 10A, unlike the second modification and the third modification, in a fourth modification, the extending length in the x direction of the third conductive layer ECL3 is short, and an end in the x-direction of the third conductive layer ECL3 is separated from the second plate-like portion ST2 and in contact with an insulating layer INU. The insulating layer INU may be made of the same insulating material as the insulating layer IN and the second interlayer insulating film IL2, for example, silicon oxide. The second plate-like portion ST2 penetrates the second interlayer insulating film IL2, the insulating layer INU, and the insulating layer IN, and terminates in the first conductive layer ECL1. The dividing portion IP is provided in the first conductive layer ECL1. Therefore, it is possible to suppress the peeling that may occur at an interface between the first conductive layer ECL1 and the insulating film BSL. Note that the insulating layer INU can be formed by performing the photolithography step, the etching step, a deposition step of the insulating film, and a planarization step after forming the third conductive layer ECL3.

In addition, as illustrated in FIG. 10B, not only the end in the x-direction of the third conductive layer ECL3 but also the end in the x-direction of the first conductive layer ECL1 may be separated from the second plate-like portion ST. In this case, the second plate-like portion ST2 penetrates the second interlayer insulating film IL2, the insulating layer INU, the insulating layer IN, and the insulating layer INL and terminates in the insulating film BSL. In this modification, the dividing portion IP is not formed in the first conductive layer ECL1 nor the third conductive layer ECL3. Here, an interface between the insulating layer INL and the insulating film BSL appears on a side surface of the slit GP2 (FIG. 7F) for the second plate-like portion ST2, and the crack may progress from this interface. However, since the insulating layer INL and the insulating film BSL can be formed of the same insulating material, the both are firmly connected to each other, and there is no difference in thermal expansion coefficient between the both, so that stress is less likely to occur. Therefore, such a crack is prevented from propagating toward the stacked body SK along the interface between the insulating layer INL and the insulating film BSL.

Note that the slit GP2 for the second plate-like portion ST2 may penetrate the insulating film BSL and reach inside the first interlayer insulating film IL1 of the peripheral circuit portion PER below the insulating film BSL, and thus the second plate-like portion ST2 may also terminate in the first interlayer insulating film IL1. In other words, the second plate-like portion ST2 may terminate in any layer of the insulating film BSL and the first interlayer insulating film IL1 as long as it is separated from the substrate S, and the wiring layer such as the via Vg and the wiring ML (FIG. 2) in the first interlayer insulating film IL1. That is, since these layers can be formed of the same insulating material, the interface is firmly connected, there is no difference in thermal expansion coefficient, and stress between the layers is less likely to occur, and by terminating the second plate-like portion ST2 while separating from the substrate S and the wiring layer which are different in material from these layers, the propagation of the peeling at the interface can be effectively suppressed.

Figure 11A:
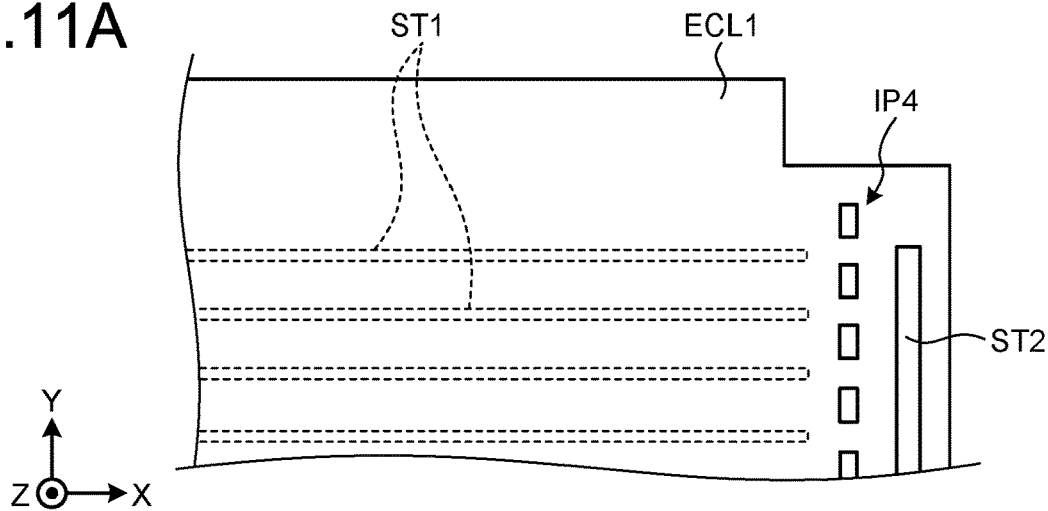
FIGS. 11A to 11C are partial top views illustrating the modifications of the dividing portion of the semiconductor storage device according to the embodiment.
Figure 11B:
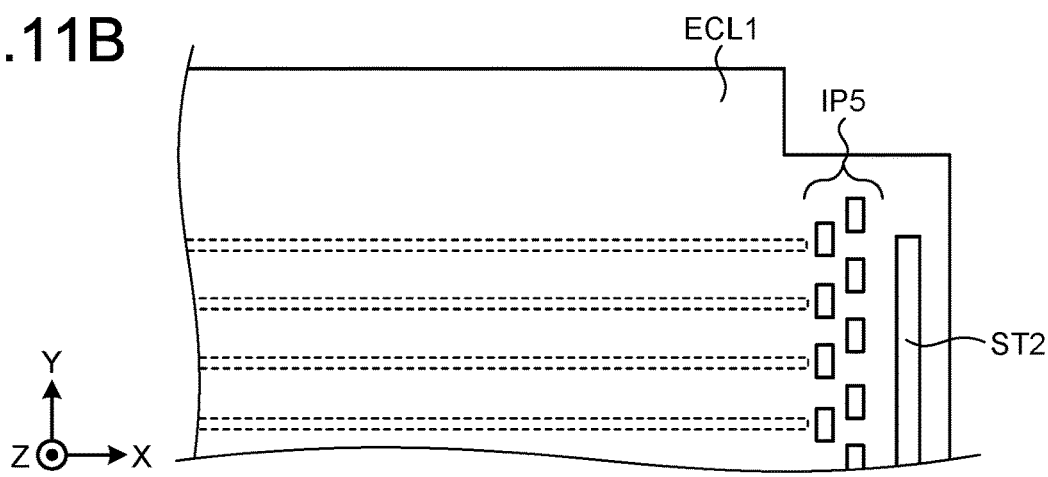
Figure 11C:
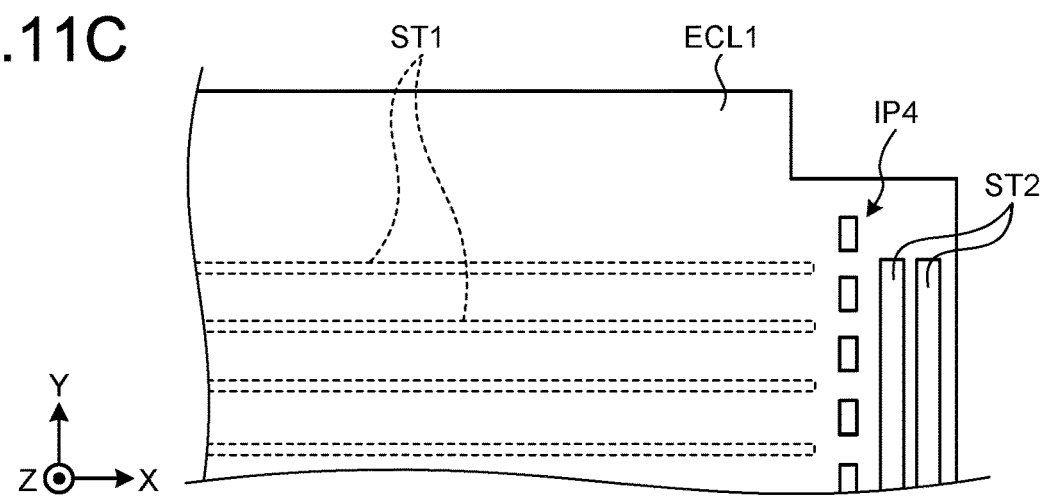

Next, another modification of the dividing portion will be described with reference to FIGS. 11A to 11C. FIGS. 11A to 11C are partial top views illustrating the dividing portion. That is, the dividing portion in the following modification is different from the above-described dividing portion IP and the like in a plan view shape.

(Fifth Modification)

As illustrated in FIG. 11A, a dividing portion IP4 in a fifth modification extends not continuously but intermittently in the y direction. Even in such a case, the peeling that can occur between the first conductive layer ECL1 and the insulating film BSL as a base layer thereof is suppressed by the dividing portion IP4.

(Sixth Modification)

As illustrated in FIG. 11B, a dividing portion IP5 in a sixth modification is configured such that the same plan view shape as that of the dividing portion 154 in the fifth modification is arranged in two columns in the x direction. In addition, the dividing portion IP5 of the two columns is arranged to be shifted from each other in the y direction between the columns. Therefore, the peeling that can occur between the first conductive layer ECL1 and the insulating film BSL as the base layer thereof can be more effectively suppressed by the dividing portion IP5.

As illustrated in FIG. 11C, the second plate-like portion ST2 may be formed in two columns side by side in the x direction, or may be arranged in three columns or four or more columns. In addition, although the dividing portion 154 is illustrated in FIG. 11C, the second plate-like portion ST2 in two columns and any one of the dividing portions IP, IP1 to IP3, and 155 may be provided. Further, the plan view shapes of the dividing portions 152 and IP3 may be the same as that of the dividing portion 1P4, and the dividing portions 152 and 153 may be arranged in two columns in the x direction. In other words, the plan view shapes of the dividing portions IP, and IP1 to 153 may not extend continuously but may extend intermittently in the y direction, similarly to the dividing portion IP4. Further, following the dividing portion IP5, the dividing portions IP, IP1 to IP3 extending intermittently may be provided to be shifted in the y direction in two columns.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a stacked body in which a plurality of conductive layers and a plurality of insulating layers are alternately stacked one by one, and a stepped portion including the conductive layers is formed to be faced to an end in a first direction;
   a columnar body penetrating the stacked body and including a memory cell formed in a portion facing at least one of the conductive layers;
   a conductive member electrically connected to the columnar body below the stacked body and extending to a region laterally below the stacked body beyond the stepped portion in the first direction;
   a plate-like portion extending in a stacking direction of the stacked body in a lateral region of the stacked body to reach the conductive member, and extending in a second direction intersecting the stacking direction and the first direction; and
   a dividing portion disposed in the conductive member on the stepped portion side with respect to the plate-like portion, the dividing portion partially dividing the conductive member, and including an insulating material, wherein
   the conductive member includes:
     a first portion electrically connected to the columnar body; and
     a second portion extending from the first portion to the stepped portion side in the first direction, and
   the second portion includes:
     a first layer electrically conducting with the first portion; and
     a third layer provided above the first layer with an insulating second layer interposed therebetween and electrically conducting with the first portion.

2. The semiconductor storage device according to claim 1, wherein
   the plate-like portion extending in the stacking direction terminates in the first layer, and
   the dividing portion is provided in the first layer.

3. The semiconductor storage device according to claim 1, wherein
   the plate-like portion extending in the stacking direction terminates in the third layer, and
   the dividing portion is provided in the third layer.

4. The semiconductor storage device according to claim 1, wherein the dividing portion is provided in the first layer and the third layer.

5. The semiconductor storage device according to claim 1, wherein
   an extending length in the first direction of the third layer is shorter than an extending length in the first direction of the first layer,
   an end in the first direction of the third layer is separated from the plate-like portion, and
   the dividing portion is provided in the first layer.

6. The semiconductor storage device according to claim 1, wherein the dividing portion intermittently extends in the second direction.

7. The semiconductor storage device according to claim 1, wherein the dividing portion is arranged in two columns in the first direction while intermittently extending in the second direction, and the dividing portion of the two columns is shifted from each other in the second direction between the columns.

8. The semiconductor storage device according to claim 1, wherein the plate-like portion is arranged in two columns side by side in the first direction.

9. The semiconductor storage device according to claim 1, wherein the plate-like portion is disposed at a position within 5 μm in the first direction from the end in the first direction of the stacked body.

10. The semiconductor storage device according to claim 1, wherein the dividing portion includes a same insulating material as an insulating film disposed below the conductive member.

11. The semiconductor storage device according to claim 10, further comprising a wiring layer disposed below the conductive member via the insulating film.

12. The semiconductor storage device according to claim 1, wherein
    an extending length in the first direction of the first layer is shorter than an extending length in the first direction of the third layer,
    the plate-like portion extending in the stacking direction reaches a portion of the third layer extending in the first direction beyond the first layer, and
    the dividing portion is provided in the third layer.

13. The semiconductor storage device according to claim 12, wherein the plate-like portion terminates in an insulating layer disposed below the third layer.

14. The semiconductor storage device according to claim 13, wherein the insulating layer disposed below the third layer includes a same insulating material as an insulating film disposed below the first layer.

* * * * *